US011168400B2

(12) United States Patent
Arvin et al.

(10) Patent No.: US 11,168,400 B2
(45) Date of Patent: Nov. 9, 2021

(54) FORMATION OF TERMINAL METALLURGY ON LAMINATES AND BOARDS

(71) Applicant: INTERNATIONAL BUSINESS MACHINES CORPORATION, Armonk, NY (US)

(72) Inventors: Charles L. Arvin, Poughkeepsie, NY (US); Brian Michael Erwin, Millbrook, NY (US); Chris Muzzy, Burlington, VT (US); Thomas Weiss, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 16/014,579

(22) Filed: Jun. 21, 2018

(65) Prior Publication Data

US 2019/0390348 A1    Dec. 26, 2019

(51) Int. Cl.
    *C25D 5/02*    (2006.01)
    *C23C 18/16*   (2006.01)
    (Continued)

(52) U.S. Cl.
    CPC ...... *C23C 18/1664* (2013.01); *C23C 18/1619* (2013.01); *C23C 18/1879* (2013.01); *C25D 5/02* (2013.01); *H05K 3/181* (2013.01)

(58) Field of Classification Search
    None
    See application file for complete search history.

(56) References Cited

U.S. PATENT DOCUMENTS 4,511,595 A    4/1985  Inoue
4,659,587 A    4/1987  Imura
                (Continued)

FOREIGN PATENT DOCUMENTS

CN    87207685 U    3/1988
CN    87216897 U    8/1988
                (Continued)

OTHER PUBLICATIONS

Worroll et al., "Rework of boards by through hole plating of individual boards", Proceedings of the Printed Circuit World Convention II vol. 1, (1981), pp. 346-359.
(Continued)

*Primary Examiner* — Stefanie S Wittenberg
(74) *Attorney, Agent, or Firm* — L. Jeffrey Kelly; Otterstedt, Wallace & Kammer, LLP

(57) ABSTRACT

At least one plating pen is brought into aligned relationship with at least one hole defined in a board. The pen includes a central retractable protrusion, a first shell surrounding the protrusion and defining a first annular channel therewith, and a second shell surrounding the first shell and defining a second annular channel therewith. The protrusion is lowered to block the hole and plating material is flowed down the first channel to a surface of the board and up into the second channel, to form an initial deposit on the board surface. The protrusion is raised to unblock the hole, and plating material is flowed down the first annular channel to side walls of the hole and up into the second annular channel, to deposit the material on the side walls of the hole.

12 Claims, 5 Drawing Sheets

(51) Int. Cl.
*H05K 3/18* (2006.01)
*C23C 18/18* (2006.01)

(56) References Cited

U.S. PATENT DOCUMENTS

| | | | |
|---|---|---|---|
| 4,766,009 A | 8/1988 | Imura | |
| 4,823,277 A * | 4/1989 | Reed | H05K 3/0008 216/18 |
| 4,904,340 A | 2/1990 | Miracky | |
| 4,938,996 A | 7/1990 | Ziv | |
| 5,292,418 A | 3/1994 | Morita | |
| 5,303,618 A | 4/1994 | Norell | |
| 5,830,334 A * | 11/1998 | Kobayashi | C25D 5/08 204/224 R |
| 6,322,684 B1 | 11/2001 | Hodko | |
| 2003/0085118 A1 * | 5/2003 | Tench | H01L 21/2885 204/224 R |
| 2014/0251815 A1 | 9/2014 | Hu | |
| 2016/0174389 A1 * | 6/2016 | Hunter | C25D 5/02 205/98 |

FOREIGN PATENT DOCUMENTS

| | | | | |
|---|---|---|---|---|
| JP | 5127822 | * | 3/1976 | C25D 5/02 |
| JP | 62250194 | * | 10/1987 | C25D 5/02 |
| JP | 63109186 | * | 5/1988 | C25D 5/026 |

OTHER PUBLICATIONS

Romankiw et al., "Laser Enhanced Etching and Plating Employing High Viscosity Etching and Plating Solution", PCOM000055519D, Feb. 13, 2015. (Cover Plus p. 1).

Brady et al., "Localized Electroplating Process", IPCOM000110486D, Mar. 25, 2005. (Originally disclosed as: Research Disclosure n342 11-92,1992) (Cover Plus p. 1).

Worroll et al., "Rework of boards by through hole plating of individual boards", Proceedings of the Printed Circuit World Convention II vol. 1, pp. 346-359 (1981)(Abstract Only 1 Page).

* cited by examiner

FORMATION OF TERMINAL METALLURGY ON LAMINATES AND BOARDS

BACKGROUND

The present invention relates to the fabrication of integrated circuits (ICs) and related structures, and more specifically, to plating pens useful in fabrication of boards and laminates employed in connection with higher assemblies of integrated circuits.

The land grid array (LGA) is a type of surface-mount packaging for integrated circuits (ICs) that has the pins on the socket (where a socket is used) rather than the integrated circuit. An LGA can be electrically connected to a printed circuit board (PCB) either by the use of a socket or by soldering directly to the board. For boards requiring land grid array (LGA) connections, the NiP/Au (gold is typically the finishing film, via immersion, over the nickel-phosphorous) plating on the board leads to a 10% increase in cost directly due to the plating.

With current improvements in memory technologies, and the need to more rapidly provide data to the processor, there is a push to start looking at direct attachment of processors and memory to boards. This will increase the need to have both (i) reworkable (NiAu is one non-limiting example) and (ii) low capacitance joints (solder joints) directly to the boards. Current techniques either are incapable of fabricating such structures or are prohibitively expensive.

SUMMARY

Principles of the invention provide techniques for formation of terminal metallurgy on laminates and boards. In one aspect, an exemplary method includes bringing into aligned relationship with at least one hole defined in a board at least one plating pen. The at least one plating pen includes a central retractable protrusion, a first shell surrounding the protrusion and defining a first annular channel therewith, and a second shell surrounding the first shell and defining a second annular channel therewith. Additional steps include lowering the retractable protrusion to block the at least one hole; with the at least one hole blocked, causing plating material to flow down the first annular channel to a surface of the board and up into the second annular channel, to form an initial deposit of the plating material on the surface of the board; raising the retractable protrusion to unblock the at least one hole; and, with the at least one hole unblocked, causing plating material to flow down the first annular channel to side walls of the at least one hole and up into the second annular channel, to deposit the plating material on the side walls of the at least one hole.

In another aspect, an exemplary apparatus includes at least one plating pen. The at least one plating pen in turn includes a central retractable protrusion; and a first shell surrounding the protrusion and defining a plating material supply channel therewith. The first shell has a board-engaging end. Also included are a second shell surrounding the first shell and defining a plating material collection channel therewith; and a plurality of electrical contacts formed on the board-engaging end of the first shell.

In still another aspect, another exemplary method includes bringing into aligned relationship with at least one hole defined in a board at least one plating pen. The at least one plating pen includes a first shell defining a first channel therewith, and a second shell surrounding the first shell and defining a second channel therewith. The second channel is annular. Further steps include inserting the at least one plating pen into the at least one hole; and causing plating material to flow down the first channel into the at least one hole and up into the second, annular, channel, to deposit the plating material into the at least one hole to form a plug therein.

As used herein, "facilitating" an action includes performing the action, making the action easier, helping to carry the action out, or causing the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments may provide one or more of the following advantages:

Reduces cost of boards by about 10% (about $1,000 per board);

Provides more robust terminal metallurgy on boards;

Enables plating unique terminal metallurgies including solders; and/or

Enables removal of solder from laminates for rework or dressing applications (i.e. chip-scale packages (CSPs) or daughter cards).

These and other features and advantages of the present invention will become apparent from the following detailed description of illustrative embodiments thereof, which is to be read in connection with the accompanying drawings.

DETAILED DESCRIPTION

As noted above, the land grid array (LGA) is a type of surface-mount packaging for integrated circuits (ICs) that has the pins on the socket (where a socket is used) rather than the integrated circuit. An LGA can be electrically connected to a printed circuit board (PCB) either by the use of a socket or by soldering directly to the board. For boards requiring land grid array (LGA) connections, the NiP/Au plating on the board leads to a 10% increase in cost directly due to the plating.

With current improvements in memory technologies, and the need to more rapidly provide data to the processor, there is a push to start looking at direct attachment of processors and memory to boards. This will increase the need to have both (i) reworkable (e.g. NiAu) and (ii) low capacitance joints (solder joints) directly to the boards. Current techniques either are incapable of fabricating such structures or are prohibitively expensive.

We have noted that electrolytic Ni and electrolytic Au are superior to electroless Ni and Au. Advantageously, one or more embodiments enable not only low cost electroless plating on boards but an electrolytic method as well.

Indeed, one or more embodiments provide a tool and/or a method to enable terminal metallurgy such as ENIPG (electroless nickel phosphorous with immersion gold), electrolytic Ni/Au for enhanced robust gold pads, electrolytic Ni/electrolytic Cu for ball grid array (BGA) type joints and solder plating for pre-tinning. The electrolytic Ni enables higher EM (electromigration lifetime) capable joints.

One or more embodiments provide a plating pen that has a retractable protrusion on the end that can go inside of plated through-holes (PTH) on boards and that moves in during the plating process to form a plug. This advantageously enables plating directly on groups of PTH or on individual PTH in the case there is a rework needed.

The skilled artisan will appreciate that matching the coefficient of thermal expansion (CTE) is pertinent in various applications. Non-limiting examples of structures that can be created using one or more embodiments include:

Electroless NiP/Immersion Au/Heavy Au
Cu (plug or conformal)/Ni/Thick Au (LGA)
Ni (plug or conformal)/Thick Au (LGA)
Cu (plug or conformal)/Ni/Cu finish (BGA)
Ni (plug or conformal)/Cu (BGA)
Ni (plug or conformal)/Cu/solder (BGA).

Figure 1:
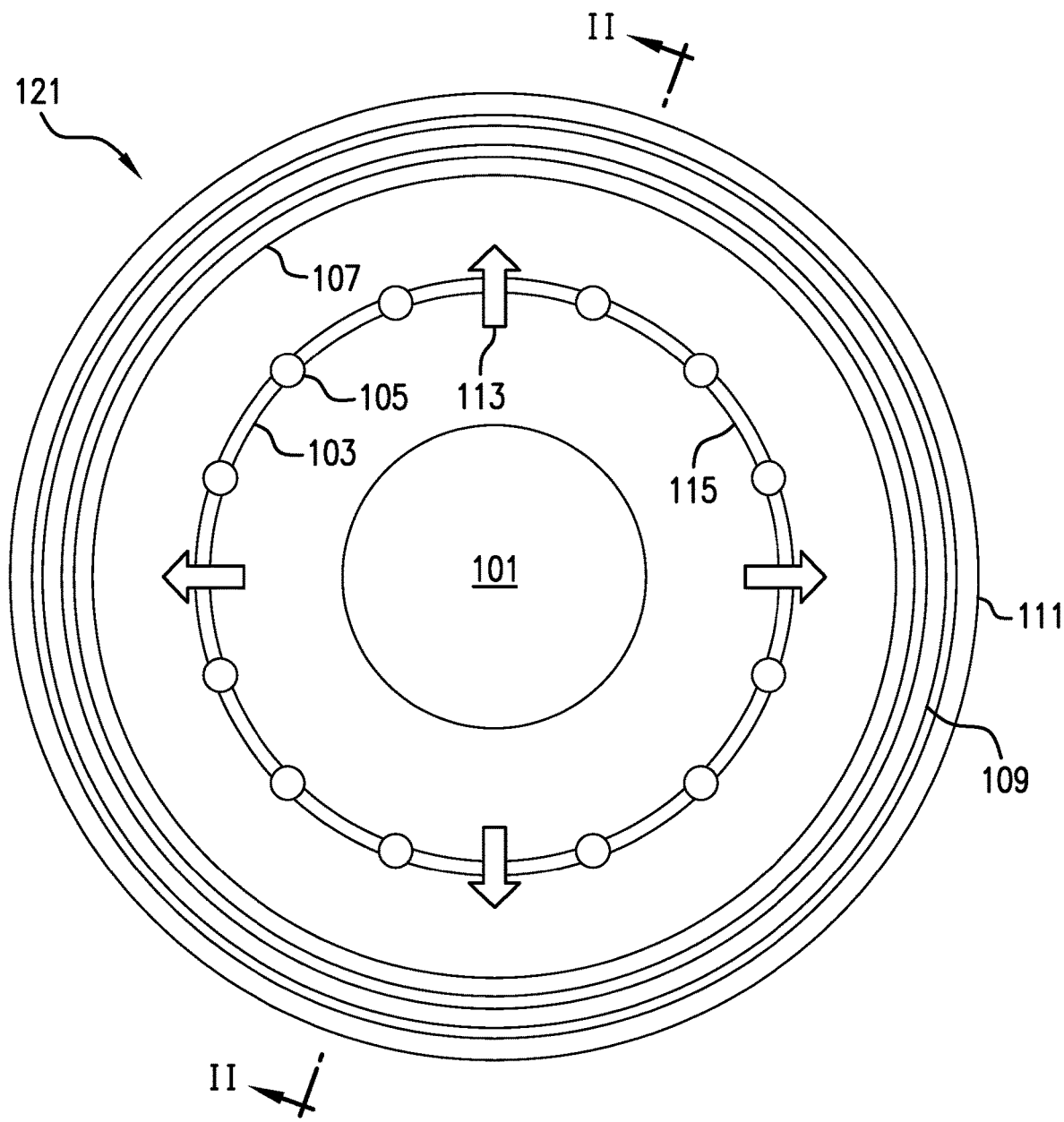
FIG. 1 is an end view of an exemplary plating pen, according to an aspect of the invention.

FIG. 1 is an end view of an exemplary plating pen 121, according to an aspect of the invention, generally representative of both electroless and electrolytic embodiments. The pen includes a series of concentric tubes (inner shell 103, middle shell 107, and outer shell 111), as well as a retractable tip 101 made of polymer or glass, in the shape of a cone that pushes into the hole (e.g., PTH)—see FIG. 2—but can be pulled out during plating to allow formation of a plug. The pen has conductive contacts 105 (only one is numbered to avoid clutter) on the end that pushes against the PTH (preferably a conductive oxide such as Ta/$Ta_2O_5$). A porous frit 109 is provided around the middle shell 107 to inhibit flow of chemicals from the pen.

Figure 5:
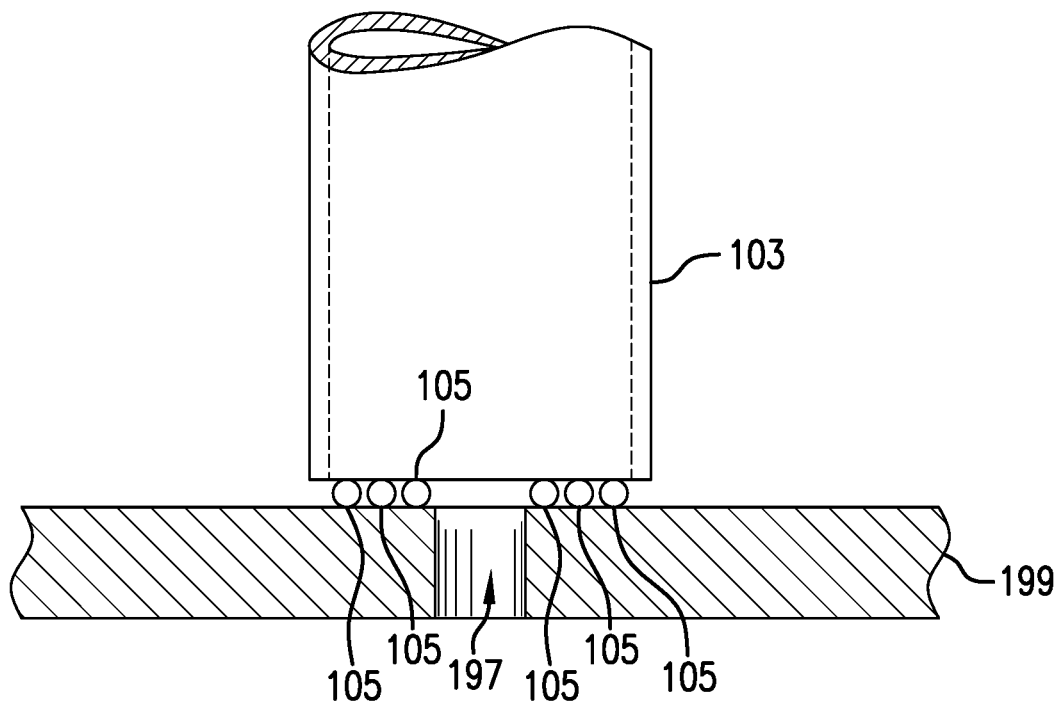
FIG. 5 shows a stand-off detail of a portion of the plating pen of FIGS. 1 and 2, according to an aspect of the invention.

In operation, one or more embodiments flow plating solution down into the pen (i.e., within the interior of inner shell 103) and up the next tube (i.e., into the space between inner shell 103 and middle shell 107 as indicated by arrows 113; only one arrow is numbered to avoid clutter). Contacts 105 act as stand-offs, with an annular space between that allows the plating solution to pass, as seen in FIG. 5. Stand-offs can also be provided on middle shell 107 if desired, and frit 109 can be moved to the gap between 103 and 107 if desired.

In both electroless and electrolytic embodiments, the central tube 103 including the contacts 105 functions as a quasi-reference electrode 115 in relation to the middle shell 107 which functions as an anode or a cathode, depending on the plating chemistry. In the electroless embodiment, these electrodes enable an electrolytic strike process to initiate NiP plating without the need for normal catalysis processes. In the electroless aspect, the embodiment of FIG. 1 provides the central tube 103 the ability to vent the hydrogen being generated during NiP plating, while in the electrolytic aspect, the embodiment of FIG. 1 provides the central tube 103 the ability to vent the oxygen being generated during plating on the anode. For example, stand-offs on the end of middle shell 107 (not illustrated to avoid clutter but could be formed similar to those shown on inner shell 103 in FIG. 5) allow the vented material to be drawn into the annular space where the frit is located, the elements 103 and/or 107 could include perforations; and/or the vented material could be extracted at the right ends (in FIG. 2, discussed below) of the annular regions.

In one or more embodiments, the flow of the plating solution is driven by the electrical charges and the vacuum pump 195 helps to prevent excess deposition and to remove at least a portion of the vapors.

Figure 2:
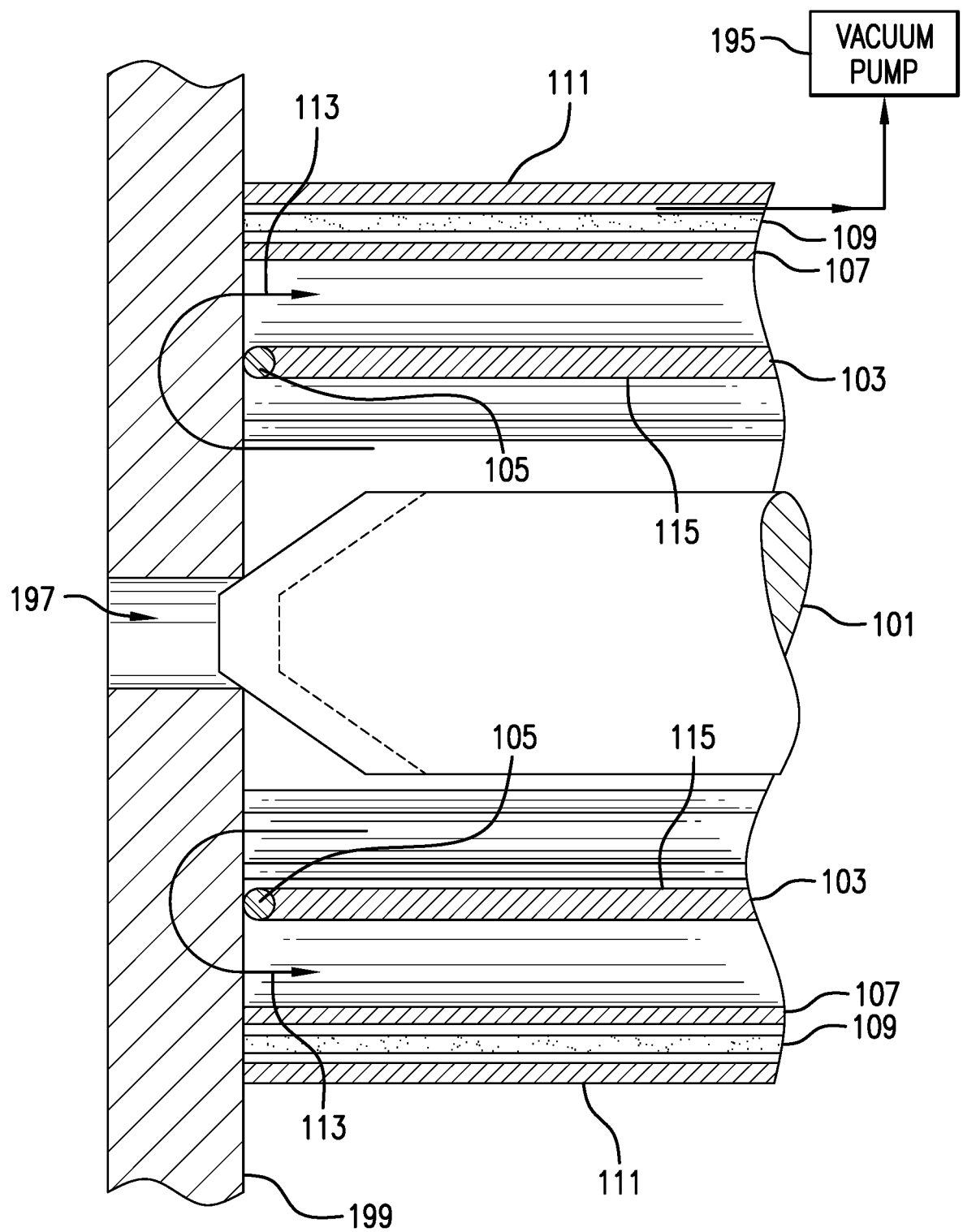
FIG. 2 depicts a side cross-sectional view of the pen of FIG. 1 along line II-II thereof, in relation with a board having one or more plated through holes (PTH) to be plated by the pen.

FIG. 2 depicts a side cross-sectional view of the pen 121 of FIG. 1 along line II-II thereof, in relation with a board 199 having one or more plated through holes (PTH) 197 to be plated by the pen 121. FIG. 5 depicts a detail of inner shell 103, contacts 105 acting as stand-offs, and board 199 with hole 197. Tip 101 is shown in FIG. 2 inserted into hole 197; the retracted position of tip 101 is shown in dashed lines. Tip 101 is shown as tapered but in other embodiments could have a flat bottom and a diameter slightly larger than hole 197. In another embodiment shown in FIG. 6, the pen is smaller in diameter than the through hole (the tip 101 can be dispensed with in such cases). For a plated through hole, the tip 101 is down as shown in the solid line in FIG. 2 and the plating begins; a plated layer is created on the flat surface of board 199 (corresponding to the region 707 in view 703 of FIG. 7, discussed below). The tip 101 is then retracted to the dashed position to open the hole 197 for a short time to allow plating to occur on the sidewalls of the hole 197 (corresponding to the region 705 in view 703 of FIG. 7, discussed below). The time that the hole is opened/tip is retracted is controlled to limit the plating to the desired thickness. If desired, a flush of water or other suitable cleansing agent can be provided and different plating chemistries can then be introduced. If desired to fully plug the hole, the tip 101 can be left retracted longer to allow the entire hole to fill. Alternatively, since there are limits on the thickness of a plug that starts from the side, the embodiment shown in FIG. 6, where the entire tip enters the hole, can be used for plug fabrication, beginning at the bottom of the hole.

In one or more embodiments, a "hard" vacuum is not required from pump 195; a vacuum sufficiently below atmospheric pressure to evacuate the vapors is all that is needed. It is expected that vacuum in the range of 10-50 millitorr would be sufficient to evacuate the vapors.

Note that plating chemicals can be supplied using standard plumbing and protrusion 101 can be extended and retracted using known retraction mechanisms, as will be appreciated by the skilled artisan familiar with bath plating.

Figure 3:
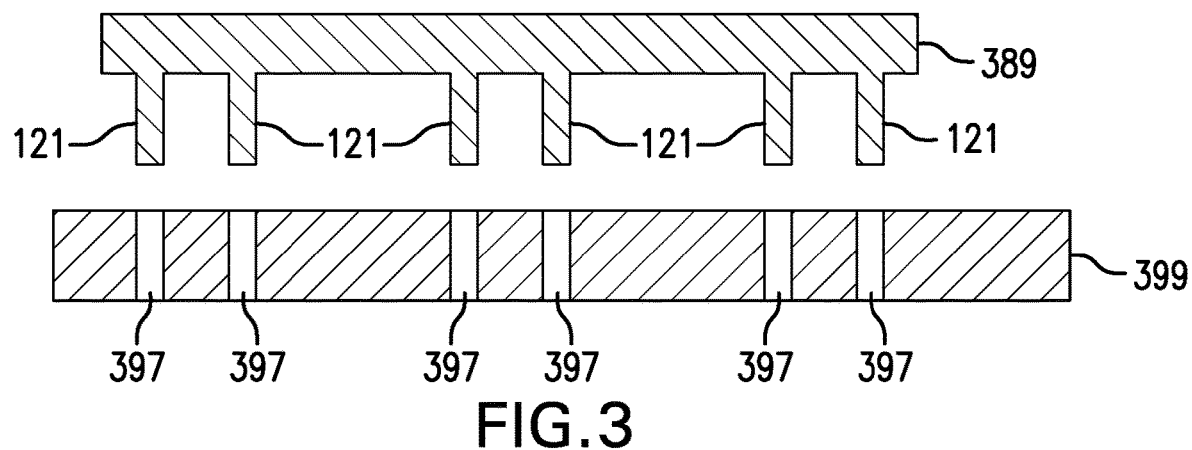
FIG. 3 shows a "gang" of plating pens configured to simultaneously plate substantially all PTH in a board.
Figure 4:
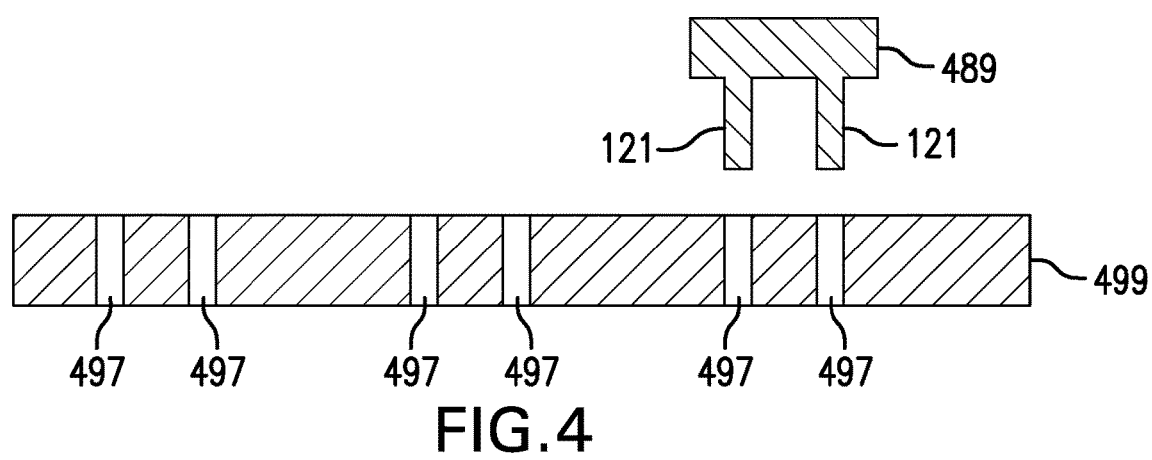
FIG. 4 shows a "gang" of plating pens configured to simultaneously plate more than one but less than all PTH in a board

In one or more embodiments, as seen in FIGS. 3 and 4, a gang fixture 389, 489 is created into which various pens 121 (and/or 621 as in FIG. 6, discussed below) can be inserted in order to plate all PTH 397 in a board 399 at one time (FIG. 3), or in order to plate (and/or plug as desired) more than one but less than all PTH 497 in a board 499 at one time (FIG. 4). Known techniques such as steppers used in circuit fabrication can be used to position and move the fixtures, and known plumbing techniques can be used to supply multiple pens with plating chemicals, water flush, etc.

In some instances, the full plating process can be carried out with a single pass by switching plating chemistries with a water flush between each plating step. For example, extend protrusion 101 to block the through hole 197, and flush with water or other cleansing agent along path 113.

Figure 6:
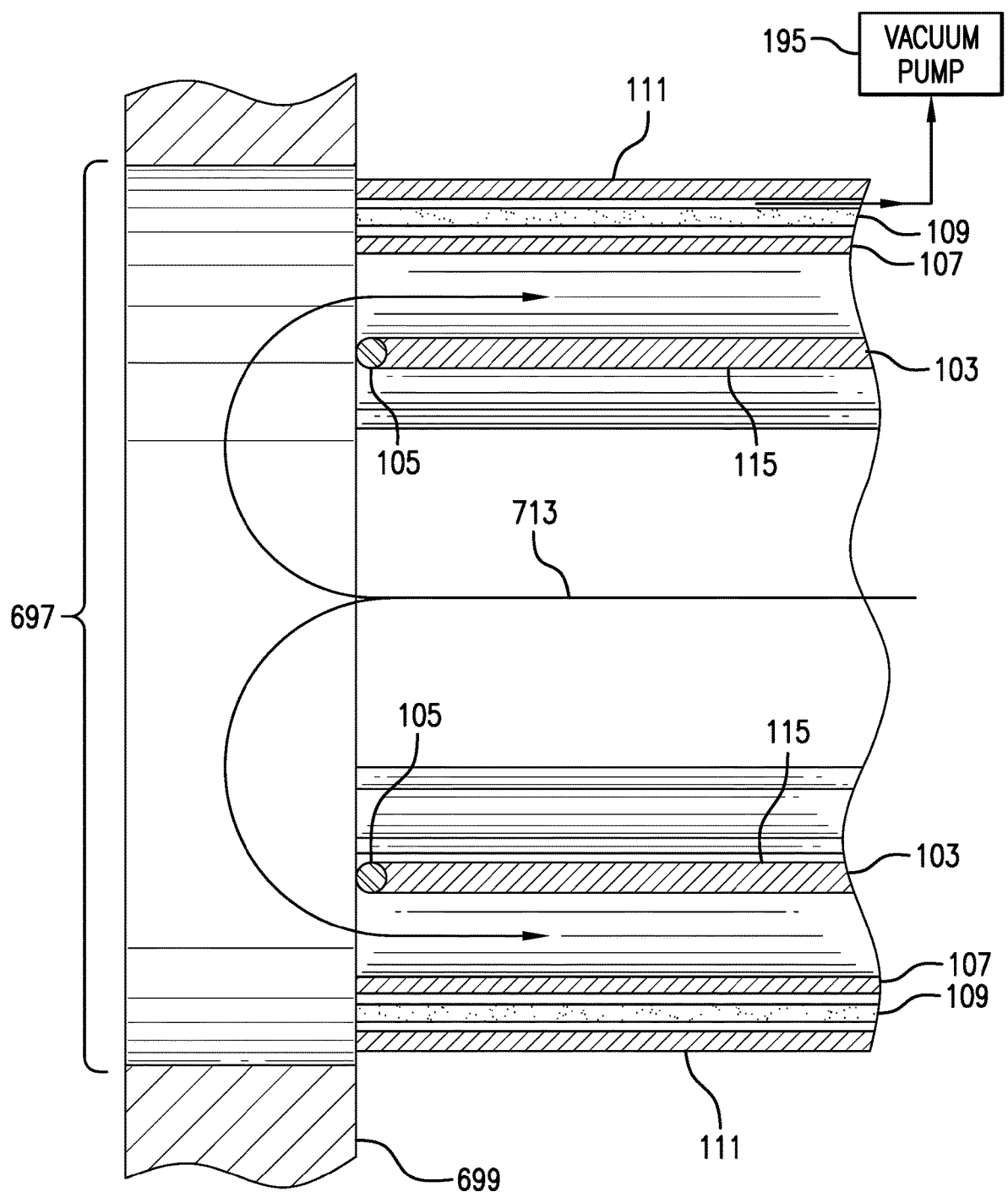
FIG. 6 depicts a side cross-sectional view of an alternative embodiment of a plating pen, according to another aspect of the invention, in relation with a board having one or more holes to be plugged by the pen.

If it is desired to conserve plating chemicals, pens can be switched, with the second groups of pens not needing the central cone 101 if the choice is to create a plug, as discussed with regard to FIG. 6. In FIG. 6, elements similar to those in FIG. 2 have received the same reference character and will not be described again. The plating pen 621 of FIG. 6 is of a diameter to fit inside the hole 697 in board 699 that it is desired to plug. The pen is shown lined up with the outer/right-hand surface of board 699, but in use is inserted into hole 697 and begins plating on the bottom/left-hand side thereof. The protrusion 101 can be omitted in the embodiment of FIG. 6.

It is possible to use the same process on laminates as well, such as plating solders onto the bottom of a CSP, or any fixture such as a socket. This aspect may be particularly appropriate for reuse/repair applications, where the process is already attached and then the cost benefits can be realized (e.g., plugging a PTH, repairing something previously plated, and the like).

One or more embodiments thus provide a plating pen that can be used for both electrolytic and electroless plating. In one or more embodiments, the pen includes a series of concentric cones 103, 107, 111 that permit escape of gases, and provide sealing and electrodes. A retractable central rod (e.g., polymer or glass) 101 is provided in some embodiments, which can seal an open PTH. One or more embodiments further include a porous frit 109 with a slight vacuum provided to prevent chemicals from escaping onto the board. The vacuum can be provided, for example, by pump 195 evacuating the region between frit 109 and outer shell 111.

One or more electrodes 105 are provided to contact the PTH to create a cathodic connection; a concentric electrode within the pen (e.g. on inner surface 115 of shell 103) act as the anode. An open vent is provided within the anode section to enable the escape of gases during plating, as discussed above.

Some embodiments set up the plating pen as a gang punch (FIGS. 3 and 4) to enable individual actuation of each pen/tip, so as to help plate multiple footprints of PTH for each product.

Some embodiments provide an electrochemical dissolution pen for removing solder from substrates either uniformly across a laminate or selectively for a rework methodology, by reversing the polarity to remove plating.

One or more embodiments reduce cost by plating more efficiently with less waste, and/or enhance robustness via increased electromigration lifetime.

One or more embodiments advantageously do not require immersing the part to be plated inside the plating chemistry.

One or more embodiments provide a pen with a retractable pen tip and/or an apparatus to plate opened holes and then seal the holes with the plated metals. Through vias can be plated using the retractable conical plug 101. The interior surface of an annular PTH can be plated in one or more embodiments. One or more embodiments do not require focused energy for activation, and/or require little or no servicing between uses. One or more embodiments do not require a power supply to be connected between the pen and the part and/or do not require the part to have a shorting layer (because the electric potential is applied across shells on the pen; as the species are flowing across they will deposit onto the part surface).

Figure 7:
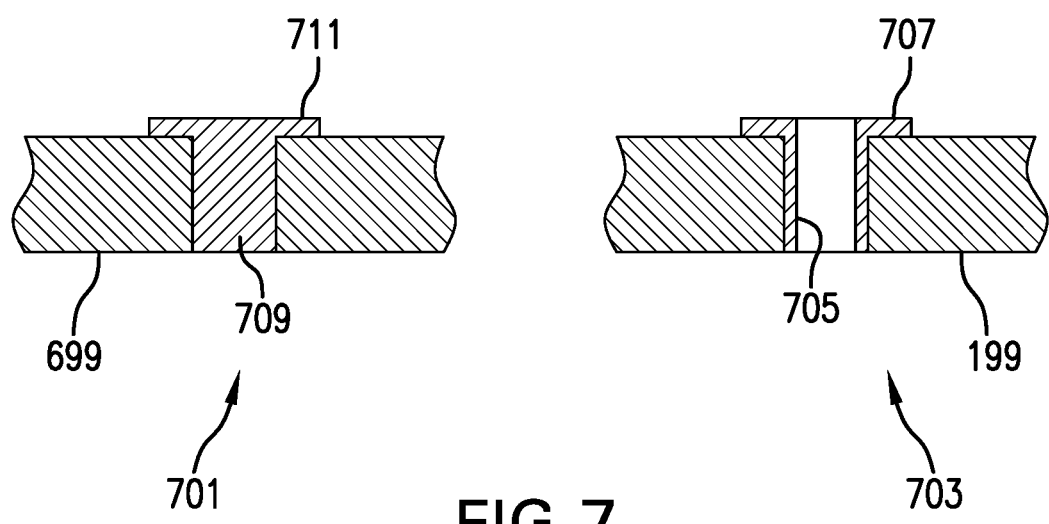
FIG. 7 shows side cross-sectional views of a plugged hole and a plated through hole formed in accordance with aspects of the invention.

FIG. 7 shows an exemplary plug structure 701 and PTH structure 703 formed in accordance with aspects of the invention. The plug structure 701 is formed in board 699 and includes body 709 and optionally flange 711, it being understood that the flange may be omitted (for example, if using the embodiment of FIG. 6 where deposition begins at the bottom of the hole). The PTH structure 703 is formed in board 199 and includes annular region 705 on the walls of the hole and annular flange 707.

Given the discussion thus far, and referring, for example, to FIGS. 1, 2, and 5, it will be appreciated that an exemplary method, according to an aspect of the invention, includes bringing into aligned relationship with at least one hole 197 defined in a board 199 at least one plating pen 121. The at least one plating pen includes a central retractable protrusion 101, a first shell 103 surrounding the protrusion and defining a first annular channel therewith, and a second shell 107 surrounding the first shell and defining a second annular channel therewith. "Aligned relationship" in this context means positioning such that the protrusion 101 is positioned so as to block the hole 197 when extended and to permit flow into the hole when retracted. A further step includes lowering the retractable protrusion 101 to block the at least one hole 197. This could be done after locating the pen or at the same time; i.e., the protrusion could be lowered already during the alignment. A still further step includes, with the at least one hole blocked, causing plating material to flow down the first annular channel to a surface of the board and up into the second annular channel, as seen at 113, to form an initial deposit of the plating material on the surface of the board. This initial deposit becomes region 707 or 711 in FIG. 7, for example.

Additional steps include raising the retractable protrusion 101 (dotted line) to unblock the at least one hole, and, with the at least one hole unblocked, causing plating material to flow down the first annular channel to side walls of the at least one hole and up into the second annular channel, as seen at 113, to deposit the plating material on the side walls of the at least one hole. This deposit becomes region 705 or 709 in FIG. 7, for example.

In some cases, said step of causing the plating material to flow down the first annular channel to the side walls of the at least one hole and up into the second annular channel, to deposit the plating material on the side walls of the board, is carried out for a predetermined limited period of time to deposit only a predetermined limited thickness of the plating material on the side walls of the at least one hole, without completely filling said at least one hole, as seen at 703 in FIG. 7.

In some instances, in the step of bringing the plating pen into aligned relationship with the at least one hole, the plating pen further includes a third shell 111 surrounding the second shell and defining a third annular channel therewith, and a porous frit 109 located in the third annular channel. A further step includes inhibiting leakage of the plating material with the porous fit by applying vacuum (e.g. from pump 195) between the porous frit and the third shell.

Advantageously, as compared to prior art approaches, in one or more embodiments, the steps are carried out without the use of bristles and/or without immersing the board in the plating material.

In one or more embodiments, said steps of causing the plating material to flow to form the initial deposit of the plating material on the surface of the board and causing the plating material to flow to deposit the plating material on the side walls of the at least one hole include applying electrical potential to cause the first shell and the second shell to function as first and second electrodes. For example, as discussed above, in both electroless and electrolytic embodiments, the central tube 103 including the contacts 105 functions as a quasi-reference electrode 115 in relation to the middle shell 107 which functions as an anode or a cathode, depending on the plating chemistry.

Advantageously as compared to the prior art, in one or more embodiments said steps are accordingly carried out without applying electric potential between the plating pen and the board (but only between the portions of the plating pen). It should be noted that the shells can be formed of any suitable materials capable of functioning as electrodes, as will be apparent to the skilled artisan; if the outer shell 111 is not to be used as an electrode, it can be formed of any material that can contain vacuum from pump 195.

As noted above, embodiments can be used with many different types of plating chemistries; in a non-limiting example, in the steps of causing the plating material to flow to form the initial deposit of the plating material on the surface of the board and causing the plating material to flow to deposit the plating material on the side walls of the at least one hole include applying electrical potential to cause the first shell and the second shell to function as first and second electrodes, the plating material includes nickel-phosphorous.

Referring to FIGS. 3 and 4, in some cases, in the step of bringing into aligned relationship with the at least one hole defined in the board the at least one plating pen, the at least one hole includes a plurality of holes 397, 497 and the at least one plating pen includes a plurality of plating pens 121 ganged together.

In additional to forming PTH, the embodiment of FIGS. 1 and 2 could also be used to form plugs in some instances; thus, in some cases, said step of causing the plating material to flow down the first annular channel to the side walls of the at least one hole and up into the second annular channel, to deposit the plating material on the side walls of the board, is carried out until the at least one hole is filled with the plating material to form a plug, as shown at 701.

In another aspect, an exemplary apparatus includes one or more plating pens 121, 621 as described herein. In the former case (121), the apparatus will include at least one plating pen 121, in turn including a central retractable protrusion 101; and a first shell 103 surrounding the protrusion and defining a plating material supply channel therewith. Said first shell has a board-engaging end adjacent board 199. Also included is a second shell 107 surrounding the first shell and defining a plating material collection channel therewith; and a plurality of electrical contacts 105 formed on the board-engaging end of the first shell.

In some cases, said at least one plating pen further includes a third shell 111 surrounding the second shell and defining a third annular channel therewith; and a porous frit 109 located in the third annular channel, and the overall apparatus further includes a vacuum pump 195 connected to apply vacuum between the porous frit and the third shell.

Advantageously, as compared to prior art approaches, in one or more embodiments, the at least one plating pen does not include bristles.

In one or more embodiments, the overall apparatus further includes a source of electrical potential interconnected across the first and second shells; this is omitted from the drawings to avoid clutter but any source familiar to the skilled artisan in the plating field can be employed.

Referring again to FIGS. 3 and 4, in one or more embodiments said at least one pen includes a plurality of plating pens 121 ganged together.

Referring now to FIG. 6, in yet another aspect, another exemplary method, according to another aspect of the invention, includes bringing into aligned relationship with at least one hole 697 defined in a board 699 at least one plating pen 621. The at least one plating pen includes a first shell 103 defining a first channel therewith, and a second shell 107 surrounding the first shell and defining a second channel therewith (said second channel is annular). "Aligned relationship" in this context means positioning such that the pen 621 can enter the hole 697 when lowered without hitting the sides of the hole 697. Further steps include inserting the at least one plating pen into the at least one hole; and causing plating material to flow down the first channel into the at least one hole and up into the second, annular, channel, as seen at 713, to deposit the plating material into the at least one hole to form a plug therein (end result seen at 701 in FIG. 7 and flange portion 711 can be omitted when using embodiment of FIG. 6).

In some instances, in the step of bringing the plating pen into aligned relationship with the at least one hole, the plating pen further includes a third shell 111 surrounding the second shell and defining a third, annular, channel therewith, and a porous frit 109 located in the third annular channel. A further step then includes inhibiting leakage of the plating material with the porous frit by applying vacuum between the porous frit and the third shell.

Advantageously, as compared to prior art approaches, in one or more embodiments, the steps are carried out without the use of bristles and/or without immersing the board in the plating material.

In one or more embodiments, said step of causing the plating material to flow includes applying electrical potential to cause the first shell and the second shell to function as first and second electrodes. For example, as discussed above, in both electroless and electrolytic embodiments, the central tube 103 including the contacts 105 functions as a quasi-reference electrode 115 in relation to the middle shell 107 which functions as an anode or a cathode, depending on the plating chemistry.

Advantageously as compared to the prior art, in one or more embodiments the steps are accordingly carried out without applying electric potential between the plating pen and the board (but only between the portions of the plating pen).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   bringing into aligned relationship with at least one hole defined in a board at least one plating pen, said at least one plating pen comprising a central retractable protrusion, a one-piece first shell surrounding said protrusion and defining a first annular channel therewith, and a one-piece second shell surrounding said one-piece first shell and defining a second annular channel therewith;
   lowering said retractable protrusion to block said at least one hole;
   with said at least one hole blocked, causing plating material to flow down said first annular channel to a surface of said board and up into said second annular channel, to form an initial deposit of said plating material on said surface of said board;

raising said retractable protrusion to unblock said at least one hole; and with said at least one hole unblocked, causing plating material to flow down said first annular channel to side walls of said at least one hole and up into said second annular channel, to deposit said plating material on said side walls of said at least one hole, wherein said steps of causing said plating material to flow to form said initial deposit of said plating material on said surface of said board and causing said plating material to flow to deposit said plating material on said side walls of said at least one hole comprise applying a single first electrical potential to said one-piece first shell and applying a single second electrical potential to said one-piece second shell, wherein said first electrical potential and said second electrical potential are such that said one-piece first shell functions as a quasi-reference electrode and said one-piece second shell functions as an anode or as a cathode.

2. The method of claim 1, wherein said step of causing said plating material to flow down said first annular channel to said side walls of said at least one hole and up into said second annular channel, to deposit said plating material on said side walls of said board, is carried out for a predetermined limited period of time to deposit only a predetermined limited thickness of said plating material on said side walls of said at least one hole, without completely filling said at least one hole.

3. The method of claim 2, wherein, in said step of bringing said plating pen into aligned relationship with said at least one hole, said plating pen further comprises a third shell surrounding said one-piece second shell and defining a third annular channel therewith, and a porous frit located in said third annular channel, further comprising inhibiting leakage of said plating material with said porous frit by applying vacuum between said porous fit and said third shell.

4. The method of claim 1, wherein said steps of bringing, lowering, causing plating material to flow down said first annular channel to a surface of said board and up into said second annular channel, raising, and causing plating material to flow down said first annular channel to side walls of said at least one hole and up into said second annular channel are carried out without the use of bristles.

5. The method of claim 1, wherein said steps of causing said plating material to flow to form said initial deposit of said plating material on said surface of said board and causing said plating material to flow to deposit said plating material on said side walls of said at least one hole are carried out without immersing said board in said plating material.

6. The method of claim 1, wherein said steps of causing said plating material to flow to form said initial deposit of said plating material on said surface of said board and causing said plating material to flow to deposit said plating material on said side walls of said at least one hole are carried out without applying electric potential to said board.

7. The method of claim 1, wherein, in said step of bringing into aligned relationship with said at least one hole defined in said board said at least one plating pen, said at least one hole comprises a plurality of holes and said at least one plating pen comprises a plurality of plating pens ganged together.

8. The method of claim 1, wherein said step of causing said plating material to flow down said first annular channel to said side walls of said at least one hole and up into said second annular channel, to deposit said plating material on said side walls of said board, is carried out until said at least one hole is filled with said plating material to form a plug.

9. A method comprising:

bringing into aligned relationship with at least one hole defined in a board at least one plating pen, said at least one plating pen comprising a one-piece first shell defining a first channel therewith, and a one-piece second shell surrounding said one-piece first shell and defining a second channel therewith, said second channel being annular;

inserting said at least one plating pen into said at least one hole;

causing plating material to flow down said first channel into said at least one hole and up into said second, annular, channel, to deposit said plating material into said at least one hole to form a plug therein, wherein said step of causing said plating material to flow down said first channel into said at least one hole and up into said second, annular, channel comprises applying a single first electrical potential to said one-piece first shell and applying a single second electrical potential to said one-piece second shell, wherein said first electrical potential and said second electrical potential are such that said one-piece first shell functions as a quasi-reference electrode and said one-piece second shell functions as an anode or as a cathode.

10. The method of claim 9, wherein, in said step of bringing said plating pen into aligned relationship with said at least one hole, said plating pen further comprises a third shell surrounding said one-piece second shell and defining a third, annular, channel therewith, and a porous frit located in said third annular channel, further comprising inhibiting leakage of said plating material with said porous frit by applying vacuum between said porous frit and said third shell.

11. The method of claim 10, wherein said step of causing said plating material to flow down said first channel into said at least one hole and up into said second, annular, channel is carried out without the use of bristles and without immersing said board in said plating material.

12. The method of claim 9, wherein said step of causing said plating material to flow down said first channel into said at least one hole and up into said second, annular, channel is carried out without applying electric potential between said plating pen and said board.

\* \* \* \* \*